United States Patent [19]

Yokoyama

[11] 4,035,669

[45] July 12, 1977

[54] OPERATION-DELAYED SWITCHING CIRCUIT

[75] Inventor: Kenji Yokoyama, Hamamatsu, Japan

[73] Assignee: Nippon Gakki Seizo Kabushiki Kaisha, Hamamatsu, Japan

[21] Appl. No.: 632,897

[22] Filed: Nov. 18, 1975

[30] Foreign Application Priority Data

| Dec. 25, 1974 | Japan | 49-3740 |
|---|---|---|
| Dec. 25, 1974 | Japan | 49-3741 |
| Dec. 25, 1974 | Japan | 49-3742 |
| Dec. 25, 1974 | Japan | 49-3743 |

[51] Int. Cl.² .................. H03K 5/13; H03K 17/56
[52] U.S. Cl. .......................... 307/293; 307/246; 307/247 A; 307/255; 307/313; 361/196
[58] Field of Search ............ 307/293, 246, 247 A, 307/288, 313, 255; 328/55, 129, 131; 317/141 S

[56] References Cited

U.S. PATENT DOCUMENTS

| 3,060,331 | 10/1962 | Habisohn | 307/293 |
|---|---|---|---|
| 3,082,329 | 3/1963 | Meyer et al. | 307/293 |
| 3,132,261 | 5/1964 | Weber | 307/293 |
| 3,189,751 | 6/1965 | Winchel | 307/293 |
| 3,210,613 | 10/1965 | Prapis | 307/293 |
| 3,282,631 | 11/1966 | Mosinski | 307/293 |

Primary Examiner—Stanley D. Miller, Jr.
Attorney, Agent, or Firm—Cushman, Darby & Cushman

[57] ABSTRACT

A switching circuit designed to start operation after the lapse of a predetermined delay time from its connection to a power source. The switching circuit has a switch element which is rendered conductive when the terminal voltage of a capacitor of a time constant circuit connected to the power source for determining the delay time has reached a predetermined value. Thereafter the electric charge of said capacitor is quickly discharged through a low impedance discharge line including said switch element. Thus, when the switching circuit has once been brought into operation after the lapse of a predetermined delay time from its connection to the power source, the capacitor of the time constant circuit is substantially completely discharged in such a manner that the terminal voltage of this capacitor is restored to substantially the same value as that before the connection to the power source, thereby allowing the switching circuit to provide the constant delay time even if its reconnection to the power source is made immediately after its disconnection therefrom.

6 Claims, 7 Drawing Figures

OPERATION-DELAYED SWITCHING CIRCUIT

BACKGROUND OF THE INVENTION

1. Field of the Invention

The present invention relates to an operation-delayed switching circuit arranged to be operative after the laspe of a predetermined delay time from its connection to a power source.

2. Brief Description of the Prior Art

As the switching circuit of the aforesaid type, there has been one provided with CR (capacitor-resistor) time constant ciruitry and arranged to be operative so that the delay time is determined by the charge-up characteristics of a capacitor of this CR time constant circuit. This switching circuit has such an advantage that it is simple in construction.

However, with switching circuit of the prior art, electric charge continues to be stored in the capacitor of the CR time constant circuit over a considerably lengthy period of time even after the switching circuit which is in its operative state is disconnected from the power source. Therefore, in case this switching circuit is connected again to the power source before this charge has not been completely discharged, the switching circuit will be brought to its operative state prior to the lapse of the pre-set delay time. Thus, the delay time of the conventional switching circuit can vary depending on the time at which this circuit is connected to the power source.

SUMMARY OF THE INVENTION

It is, therefore, a primary object of the present invention to provide an operation-delayed switching circuit capable of providing a constant delay time irrespective of the time when it is connected again to the power source.

Another object of the present invention is to provide an operation-delayed switching circuit of the type mentioned above, which is simple in its circuit arrangement.

These and other objects as well as the merits of the present invention will be apparent from the following detailed description with reference to the accompanying drawings.

DETAILED DESCRIPTION OF THE PREFERRED EMBODIMENTS

Figure 1:
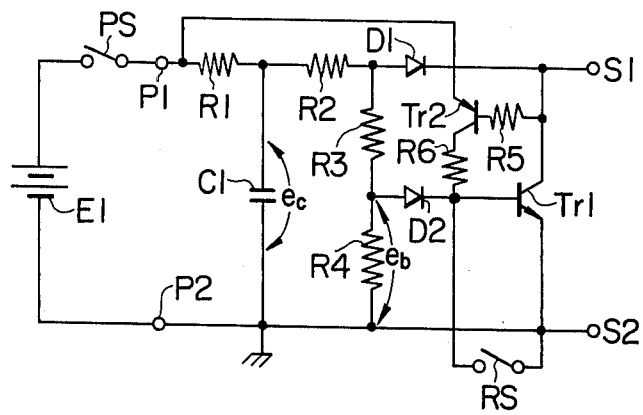
FIG. 1 is a circuit diagram showing an example of the switching circuit according to the present invention.

Prior to making the description of the preferred embodiments of the present invention, the operation-delayed switching circuit of the present invention will be outlined. In the switching circuit of the present invention, a time constant circuit including at least a capacitor, for example, a CR time constant circuit comprising a capacitor and resistors, is connected to the power source assigned for operating the switching circuit, and a discharge line is connected to the capacitor of said CR time constant circuit in parallel with this capacitor. A switch element is inserted in series in said discharge line. To the control terminal of this switch element is applied a DC voltage varying in value, following the terminal voltage of the capacitor of the CR time constant circuit. When the switching circuit is connected to the power source, the terminal voltage of the capacitor of the time constant circuit rises, following the charge-up curve which is determined by the time constant provided by the circuit. When the terminal voltage has gained a predetermined value after the lapse of a pre-set time corresponding to the dealy time, or in other words, when the DC voltage applied to the control terminal of the switch element contained in the discharge line reaches a predetermined value, this switch element is rendered conductive, bringing the switching circuit into the operative state, and along therewith the electric charge which has been charged up in the capacitor of the CR time constant circuit is substantially completely discharged through said discharge line. If the resistance of the discharge line is sufficiently small, the discharging of the capacitor will be completed in an extremely short period of time.

As stated above, in the switching circuit according to the present invention, it will be understood that when the switching circuit is rendered to its operative state, the electric charge of the capacitor of the time constant circuit is substantially completely discharged quickly, and the terminal voltage of the capacitor decreases to about zero as in the state before the circuit is connected to the power source. Therefore, in case the circuit is connected again to the power source the terminal voltage of the capacitor of the CR time constant circuit will vary, following a charge-up curve which is exactly the same as that in the initial connection to the power source. As will be understood, the delay time provided by the switching circuit of the present invention, namely, the period of time from the connection of this circuit to the power source till the time at which this circuit becomes operative is determined by the charge-up curve of the terminal voltage of the capacitor of the CR time constant circuit. Thus, a constant delay time can be obtained regardless of the time at which the switching circuit is connected again to the power source. As will be clear from the description made later, a switching output of the switching circuit can be derived at both ends of the switch element contained in the discharge line or at any arbitrary point of a conducting and self-sustaining circuit of the switch element.

The switching circuit according to the present invention will hereunder be described in detail with respect to the examples thereof.

FIG. 1 shows a basic example of the switching circuit of the present invention. Symbols P1 and P2 denote a first and a second terminal between which an operating power source E1 for the switching circuit is connected via a power switch PS. A series circuit which is formed with a resistor R1 and a capacitor C1, which series circuit, in turn, forming a CR time constant circuit, is connected between the first and the second terminals P1 and P2. A series circuit which is comprised of a resistor R2, a diode D1 and a transistor Tr1 which serves as a switch element form a discharge line connected in parallel to the capacitor C1 of the CR time constant circuit. A third terminal S1 is derived from the point of contact between the cathode electrode of the diode D1 and the collector electrode of the transistor Tr1. An output of the switching circuit is developed between the third terminal S1 and the fourth terminal S2 which forms a pair with said third terminal S1 and is grounded in common with the second terminal P2. Between the anode electrode of the diode D1 and the ground is connected a series circuit which is comprised of resistors R3 and R4. To the junction point of these two resistors R3 and R4 is connected, via a diode D2, the base electrode of the transistor Tr1 contained in the discharge line, which electrode serving as the control terminal for said transistor Tr1. These two resistors R3 and R4, the diode D2 and furthermore the resistor R2 jointly form a control voltage generating circuit which generates a DC voltage (hereinafter referred to as a control voltage) varying greatly in value in accordance with the terminal voltage of the capacitor C1 and being applied to the base electrode of the transistor Tr1. The resistor R2 is assigned to limit the current flowing to the transistor Tr1 when this transistor Tr1 is rendered conductive. The resistance value of the transistor Tr1 is selected to be sufficiently smaller than the resistance value of the resistor R1. Said resistor R2 may be omitted, depending on the case. A transistor Tr2 and resistors R5 and R6 jointly form a self-sustaining (self hold) circuit for sustaining the conducting state of the transistor Tr1. The emitter of the transistor Tr2 is connected directly to the first terminal P1, and the base and the collector thereof are connected to the third terminal S1 and the base of the transistor Tr1 via the resistors R5 and R6, respectively. The base of the transistor Tr1 is grounded via a reset switch RS for resetting the switching circuit.

Next, the operation of this example will be described.

In the open state of said reset switch RS, the power switch PS is closed to supply electric current to the switching circuit. Whereupon, the terminal voltage $e_c$ will rise in accordance with the following equation:

$$e_c = Va - A\epsilon^{-\frac{1}{\tau_1}t}$$

wherein:

$$Va = \frac{(R2 + R3 + R4)E}{R1 + R2 + R3 + R4};$$

in which: $E$ denotes the terminal voltage of the power source $E1$;

$$\tau_1 = \frac{1}{\frac{1}{c}\left(\frac{1}{R1} + \frac{1}{R2 + R3 + R4}\right)}; \text{ and}$$

A represents an integration constant. Across the resistor R4, there appears a voltage $e_b$ which is obtained by dividing the terminal voltage $e_c$ of the capacitor C1 by the ratio determined by the resistors R2, R3 and R4.

When the voltage $e_b$ gains a value greater than the sum of the forward voltage at the diode D2 and the forward voltage at the base-emitter junction of the transistor Tr1, the transistor Tr1 is rendered conductive so that the electric charge of the capacitor C1 is discharged via a series circuit which is formed with the resistor R2 of the discharge line, the forward resistor $r_{D1}$ of the diode D1 and the saturation resistor $r_{Tr1}$ of the transistor Tr1. Since the resistors $r_{D1}$, $r_{Tr2}$ and R2 are selected so as to have extremely small resistance values, the time constant $\tau_2 = C1(R2 + r_{D1} + r_{Tr2})$ at the discharging time becomes very small, so that the discharging of the capacitor C1 is completed in an extremely short period of time. Owing to this discharge, the voltage $e_b$ is caused to drop to about zero level. Due to the fact, however, that the base electrode of the transistor Tr2 of the self-sustaining circuit is grounded via the saturation resistance $r_{Tr1}$ of the transistor Tr1 so that the transistor Tr2 is biased in the forward direction, there is continuously supplied a forward base-bias current to the transistor Tr1 through the transistor Tr2 and the resistor R6. Accordingly, the transistor Tr1 is held in its conductive state. It should be understood that because of the provision of the diode D2, there will never occur that the self-sustaining current, namely, the collector current of the transistor Tr2 is shunted toward the resistor R4 side. In order to turn the transistor Tr1 off, it is only necessary that either the power source switch PS is opened or the reset switch RS is closed to stop the supply of the forward base-bias current of the transistor Tr1.

In case it is intended to directly drive a load by this switching circuit where the impedance of this load is high, the load may be connected between the third and the fourth terminals S1 and S2. However, the impedance measured acrosss the third and the fourth terminals S1 and S2, i.e. the output impedance of the switching circuit, is considerably high due to the presence of the series-connected resistor R1 and R2 in the load-current path. Accordingly, it is not desirable to directly connect a load of a low impedance between the third and the fourth terminals S1 and S2. Such a load of a low impedance desirably is connected to the switching circuit as shown in FIGS. 2 and 3.

Figure 2:
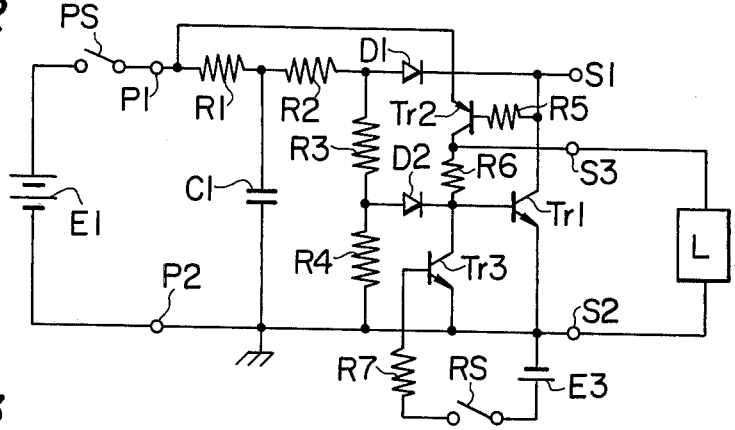
FIGS. 2 through 4 are circuit diagrams showing the examples of connection between a load and the switching circuit shown in FIG. 1.

In FIG. 2 a load L is connected between the fourth terminal S2 and the collector of the transistor Tr2 which constitutes a self-sustaining circuit. By so arranging, it will be understood that when the switching circuit is rendered to the operative state, i.e. when the transistor Tr1 is rendered conductive, the transistor Tr2 becomes conductive, and accordingly the power source PS is connected to the load L via the extremely low saturation resistance of the now conducting transistor Tr2. Accordingly, it becomes possible to cause a sufficiently high load current to flow to the load at a low loss of power.

Figure 3:
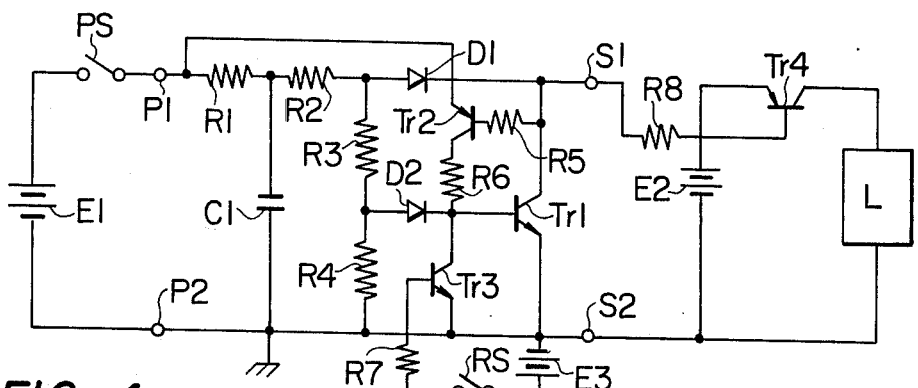

In FIG. 3, the load L is connected to another power source E2 through a transistor Tr4 and the base of this transistor Tr4 is connected to the third terminal S1 via a resistor R8. Since the transistor Tr4 is arranged as a buffer between the load L and the switching circuit, it is possible to drive a load of a low impedance without any difficulty.

Figure 4:
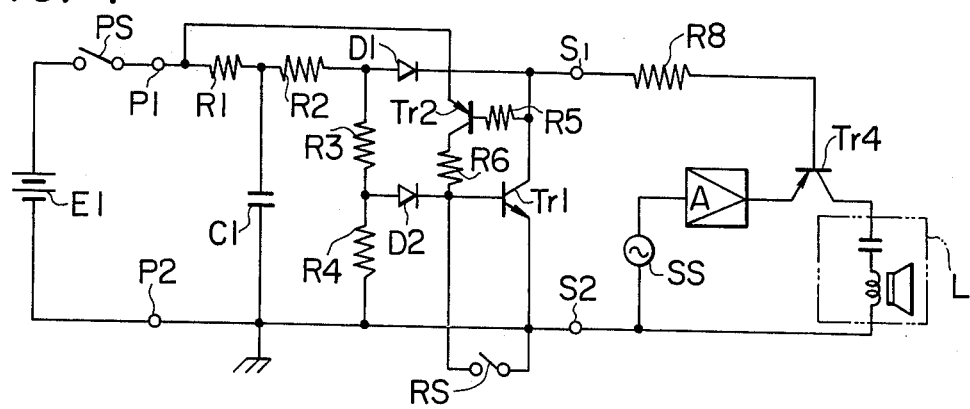

In each of the examples shown in FIGS. 2 and 3, the reset switch RS is not connected directly to he base of the transistor Tr1, but there is provided a reset circuit which is formed with the reset switch RS, a transistor Tr3, a resistor R7 and a power source E3. FIG. 4 shows a variation of the present invention, which intends to control the connection between the output terminal of an amplifier AMP and the load L which may, for example, be a speaker by the output of the switching circuit of the present invention. Symbol SS represents an input signal source of the amplifier AMP. The base electrode of a transistor Tr4 which is connected in series between the output terminal of the amplifier AMP and the load L is connected to the third terminal S1 via a resistor R8. This constitutes an initial muting circuit in an audio amplifier.

This initial muting circuit will be briefly explained below. During the period immediately after the connection of an output transformerless OTL amplifier or like devices to a power source, the behavior of the amplifier circuit is not stable so that imbalanced DC voltage tends to appear at the output terminal of this amplifier. This imbalanced DC current causes a large volume of current to flow to the speaker connected to the output terminal of the amplifier, thus bringing forth problems such as the generation of noises. It is for this reason that there is employed a so-called initial muting circuit which is intended to operate so that the speaker is cut off from the amplifier during the period immediately after the latter's connection to the power source and that after the behavior of the amplifier has come stable, the speaker is connected for the first time to the amplifier. More specifically, in this instant example, by arranging the power switch PS of the switching circuit so as to act interlockingly with the power switch (not shown) of an amplifier AMP, the operation of the whole device will be performed as follows. At the time that the amplifier AMP is connected to the power source, the transistor Tr1 of the switching circuit is in its cut-off state and accordingly the third terminal S1 is at a high potential. Thus, the transistor Tr4 is reversely biased and not rendered conductive. Therefore, the output terminal of the amplifier AMP is held to be cut off from the load L. And, when the transistor Tr1 is rendered conductive after the lapse of a delay time of the switching circuit, the transistor Tr4 is biased in the forward direction and is rendered conductive, thus causing the output terminal of the amplifier AMP to be connected to the load L via the saturation resistance of the transistor Tr4. Therefore, by setting the delay time of the switching circuit at an appropriate value, there can be prevented the application of an imbalanced DC voltage which produces immediately after the connection of the amplifier AMP to the power source. To say further, by arranging so that a detector for detecting any excessively large current flowing to the load L is provided and that the reset switch RS of the switching circuit is opened or closed by the detection signal from the detector, it is possible to protect both the amplifier AMP and the load L against such an excessively large current.

Figure 5:
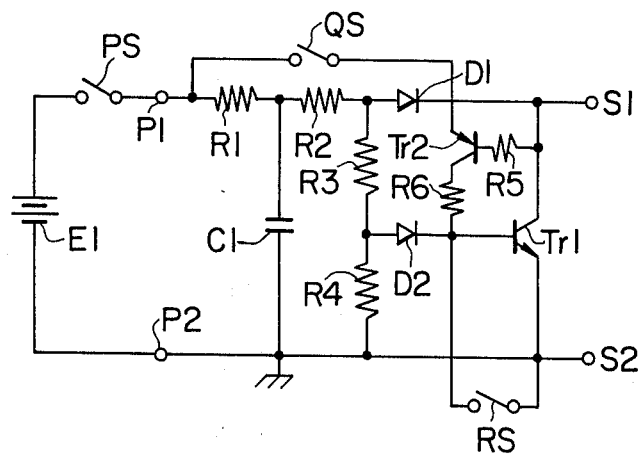
FIG. 5 is a circuit diagram showing another example of the operation-delayed switching circuit embodying the present invention.

FIG. 5 shows another variation of the present invention, wherein a switch QS is inserted in the emitter circuit of the transistor Tr2 which constitutes a self sustaining circuit of the transistor Tr1. This example is arranged so that, in the state of the whole device wherein the switch QS is closed, the device will operate in exactly the same way as the circuit shown in FIG. 1. In the state, however, that the switch QS is opened, it will exert a relaxation oscillation. More particularly, when the power switch PS is closed, the terminal voltage of the capacitor C1 will rise in accordance with the previously mentioned charge-up curve. Then, the transistor Tr1 is rendered conductive after the lapse of a delay time, and the terminal voltage of the capacitor C1 will drop in an extremely short period of time. It should be understood that in case the switch QS is opened, no self-sustaining current is supplied to the base electrode of the transistor Tr1. Therefore, the transistor Q1 will be rendered "off" at the time when the terminal voltage of the capacitor C1 had dropped to a level below a certain value, and the capacitor C1 is charged up again so that its terminal voltage will rise. As stated above, in case the switch QS is opened and thereby the operation of the self-sustaining circuit is stopped, the switching circuit will exert a relaxation oscillation. Thus, serrated pulse voltage is generated across the third and the fourth terminals S1 and S2 of this switching circuit.

Figure 6:
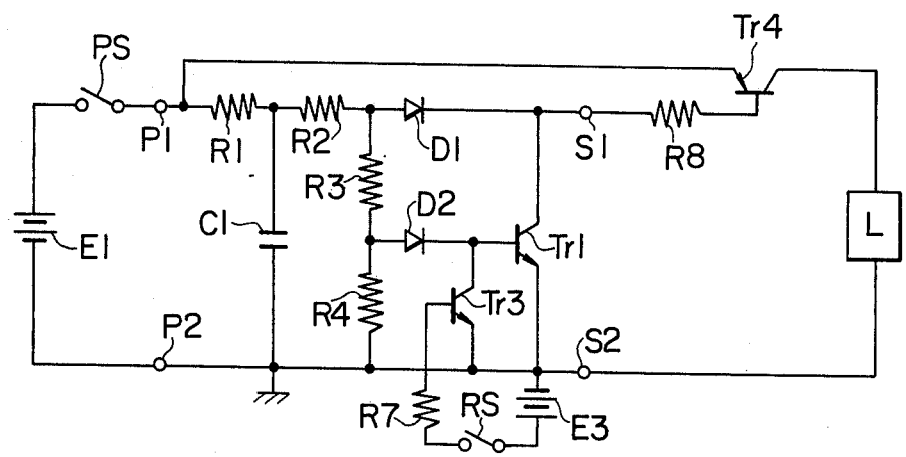
FIGS. 6 and 7 are circuit diagrams showing modifications of the operation-delayed switching circuit of the present invention.
Figure 7:
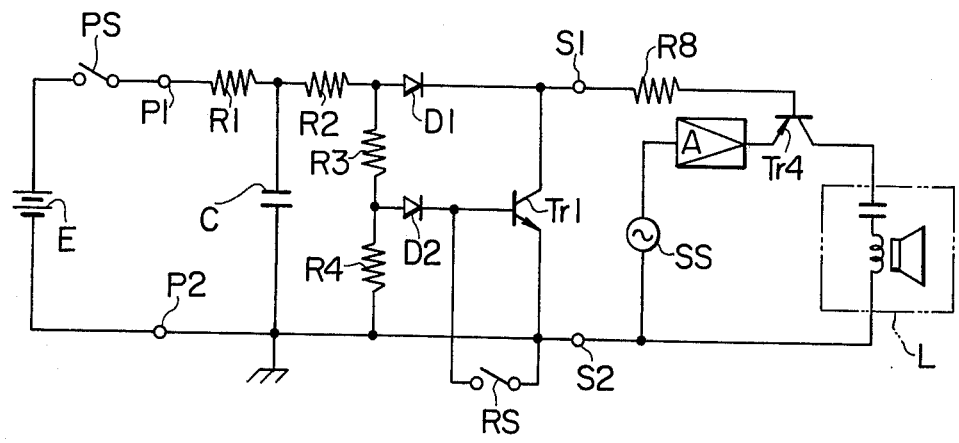

FIGS. 6 and 7 show further variations of the switching circuit of the present invention, which are arranged so that the self-sustaining circuit is omitted to perform only the relaxation oscillation.

In the example shown in FIG. 6, the base electrode of a transistor Tr4 inserted in series between the first terminal P1 and load L is connected to the third terminal S1 of the switching circuit via a resistor R8. The transistor Tr4 is arranged so that it is rendered conductive only when the transistor Tr1 is kept conductive. The connection between the load L and the power source E1 is made and broken with the oscillation cycle of the switching circuit.

In the example shown in FIG. 7, the base electrode of the transistor Tr4 inserted in series between the output terminal of the amplifier AMP and a load L such as a speaker is connected to the third terminal S1 via the resistor R8. The operation of this switching circuit may be considered the same as that of the switching circuit shown in FIG. 6.

I claim:

1. An operation-delayed switching circuit comprising:
   a power source line having a DC voltage source connected thereto;
   a time constant circuit connected to the power source line and including at least a capacitor;
   a discharge line connected in parallel with the capacitor of said time constant circuit and including a switch element having a control terminal and inserted in series therein, for discharging the electric charge of said capacitor;
   a control signal generating circuit connected to said time constant circuit including a voltae divider circuit having an output terminal connected in parallel with said capacitor and a diode connected in series between said output terminal and said control terminal, said diode having a polarity as it reverse biased by a holding voltage applied to said control terminal for generating a DC voltage varying in value in accordance with the terminal voltage of said capacitor, said DC voltage serving as a control signal applied to said control terminal of said switch element for controlling the conduction of this switch element; and
   a self-sustaining circuit of said switch element and connected to said control terminal of the switch element and continuously applying to said control terminal said holding voltage for sustaining the conduction of said switch element after said switch element is rendered conductive.

2. An operation-delayed switching circuit according to claim 1 wherein: said time constant circuit is comprised of said capacitor and of a resistor connected in series to this capacitor.

3. An operation-delayed switching circuit according to claim 1 wherein: the switch element is a transistor having base electrode serving as said control terminal.

4. An operation-delayed switching circuit according to claim 1 wherein: said self-sustaining circuit has a transistor connected between the power source line and the control terminal of the switch element, and wherein: the base electrode of said transistor is connected to a point on the discharge line at which an electric potential capable of biasing said transistor in the direction of rendering said transistor conductive at the time when the switch element is rendered conductive is obtained.

5. An operation-delayed switching circuit according to claim 1 wherein: said self-sustaining circuit includes a switch for stopping only the supply of said holding voltage to the control terminal of the switch element and keeping the connections of said discharge line and said signal generating circuit both to said time constant circuit.

6. An operation-delayed switching circuit according to claim 1 further comprising:
a switching means connected between the control terminal of the switch element and a potential point from which an electric voltage is applied to the control terminal of the switch element so as to render the switch element to the "off" state.

* * * * *